(12) United States Patent
Nadeau et al.

(10) Patent No.: US 6,495,787 B1
(45) Date of Patent: Dec. 17, 2002

(54) ELECTRICAL CONNECTION SYSTEM BETWEEN AN ELECTROCHEMICAL CELL AND A PRINTED CIRCUIT

(75) Inventors: Eric Nadeau, Savigny L'evescault (FR); Dominique DeMarty, Chasseneuil (FR); Christian Gonin, Coulombiers (FR)

(73) Assignee: Alcatel, Paris (FR)

(*) Notice: Subject to any disclaimer, the term of this patent is extended or adjusted under 35 U.S.C. 154(b) by 115 days.

(21) Appl. No.: 09/665,517

(22) Filed: Sep. 19, 2000

(30) Foreign Application Priority Data

Sep. 20, 1999 (FR) .............................. 99 11728

(51) Int. Cl.$^7$ ............................ B23K 11/11; H05K 7/08
(52) U.S. Cl. ................. 219/56.27; 219/56.21; 361/780
(58) Field of Search ........................ 219/56.22, 56.21; 361/760–783

(56) References Cited

U.S. PATENT DOCUMENTS

| 4,920,019 | A | | 4/1990 | Stoklosa et al. | |
| 5,593,604 | A | * | 1/1997 | Beasley et al. | 219/117.1 |
| 6,056,185 | A | * | 5/2000 | Daroux et al. | 228/110.1 |
| 6,141,223 | A | * | 10/2000 | Fukushima | 200/17 R |
| 6,153,834 | A | * | 11/2000 | Cole et al. | 174/254 |

FOREIGN PATENT DOCUMENTS

| EP | 0 043 586 A2 | | 1/1982 |
| EP | 0 936 847 A1 | * | 8/1999 |
| GB | 0 846559 | | 8/1960 |

* cited by examiner

Primary Examiner—M. Alexandra Elve
Assistant Examiner—Kevin McHenry
(74) Attorney, Agent, or Firm—Sughrue Mion, PLLC

(57) ABSTRACT

An electrical connection system between an electrochemical cell and a printed circuit having a copper layer, the system comprising at least one connection piece welded to the cell, wherein the layer of copper is of a thickness greater than 70 $\mu$m and wherein a metal piece electrically connected to the connection piece is fixed to the layer of copper by welding without any filler metal.

18 Claims, 1 Drawing Sheet

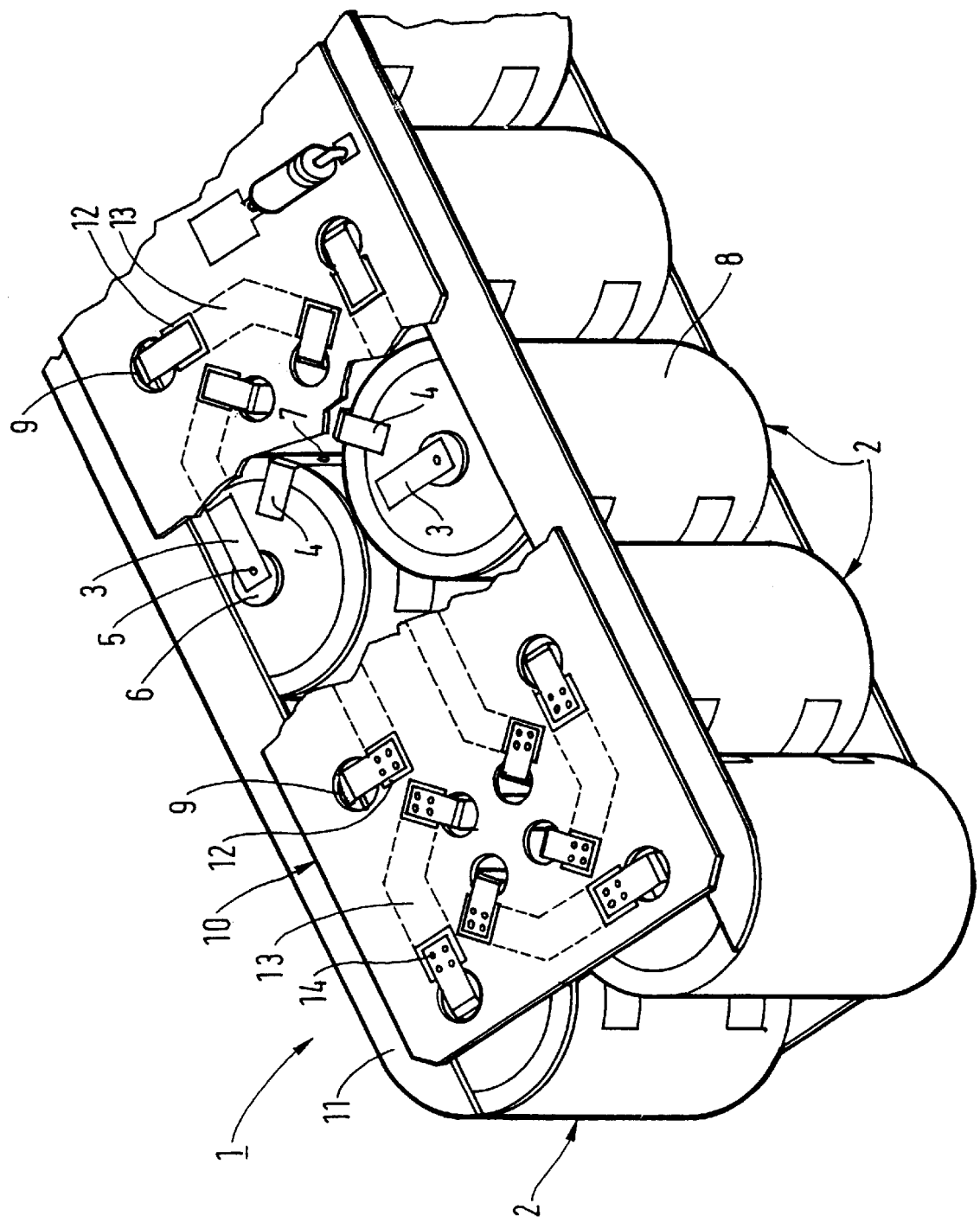

ELECTRICAL CONNECTION SYSTEM BETWEEN AN ELECTROCHEMICAL CELL AND A PRINTED CIRCUIT

The present invention relates to a system for making an electrical connection between an electrochemical cell and the copper track of a printed circuit. The invention also extends to a method of making such a connection.

BACKGROUND OF THE INVENTION

Electrical current is input or output relative to an electrochemical cell by means of terminals that extend from the cell and that are respectively of negative and positive polarity. When cells are assembled together to form a battery, they are electrically interconnected in series or in parallel. Connections between cells are usually made by means of an electronics card carrying an interconnection printed circuit. The card is generally designed to enable an electronic safety device to be inserted in the battery.

A connection device comprising one or more electrically interconnected pieces is welded to the terminal of the electrochemical cell and its opposite end is soldered to the copper layer constituting the track of the printed circuit. The term "soldering" is used to designate any operation whereby metal pieces are assembled together by means of a filler metal having a melting point that is lower than that of the pieces to be united. Soldering to the layer of copper is usually performed with the help of flexible conductors.

Making such a connection and feeding it with solder involves drawbacks which can make numerous batteries unusable or even dangerous. In particular, solder can be splashed onto the electronics card during the soldering operation, thereby running the danger of damaging a component or giving rise subsequently to short circuits. In addition, it has been found that short circuits can arise because of subsequent migration of solder.

The use of flexible wires also means that there is a risk of the wires being swapped over during assembly. In addition, using flexible wires makes it difficult to automate manufacturing operations and means that a larger number of inspections must be performed.

OBJECTS AND SUMMARY OF THE INVENTION

An object of the present invention is to propose an electrical connection system between an electrochemical cell and a printed circuit, which system is more reliable than the known system both in terms of manufacturing reject rate and in terms of battery lifetime.

The present invention provides an electrical connection system between an electrochemical cell and a printed circuit having a copper layer, said system comprising at least one connection piece welded to said cell, wherein said layer of copper is of a thickness greater than 70 $\mu$m and wherein a metal piece electrically connected to said connection piece is fixed to said layer of copper by welding without any filler metal.

The term "welding" is used to designate an operation consisting in uniting metal pieces in such a manner as to provide continuity, and in particular electrical continuity, between said pieces. In this case welding is performed by applying melting heat and/or pressure, and without using a filler metal.

When the layer of copper is 70 $\mu$m thick or less, welding cannot be performed. Under such circumstances, the layer of copper is observed to melt or come unstuck. The layer of copper is preferably at least 105 $\mu$m thick.

The thickness of the metal piece is at least 80 $\mu$m and preferably lies in the range 80 $\mu$m to 200 $\mu$m. In a particular embodiment of the invention, said piece is at least 100 $\mu$m thick and preferably its thickness lies in the range 125 $\mu$m to 140 $\mu$m.

The metal piece is a conductive piece made of a metal selected from nickel, nickel-plated steel, stainless steel, and copper.

In a particular embodiment of the invention, said piece constitutes said connection piece itself. However the nickel piece could also be connected to the cell via one or more other pieces, with electrical continuity being provided by welding said pieces together. In particular, the metal piece can be welded to the connection piece which is itself made of nickel, of steel, or of nickel-plated steel. Thus, electrical continuity between the cell and the interconnection circuit is provided solely via welds that do not include any filler metal.

The present invention has the advantage of making it simpler, more reliable, and less expensive to interconnect electrochemical cells in a battery, specifically by reducing welding time by about 60% and dividing the reject rate due to assembly errors or to damage to electronic circuits by 10. In addition, assembly operations are easier to automate.

The resulting weld can be characterized by the usual methods, mainly its electrical properties, by measuring its resistance, and its mechanical properties by measuring its breaking strength when subjected to a perpendicular traction force or by measuring its shear strength under an axial traction force.

The resistance of the connection after said piece has been welded to said copper layer is no greater than 0.07 m$\Omega$ for a current of 5 A.

The breaking strength after said piece has been welded to said layer of copper is not less than 1.5 daN, and the shear strength is not less than 8 daN.

The invention also provides an electrochemical cell connected to a printed circuit by such an electrical connection system, and a battery of such electrochemical cells. The battery can equally well be of primary cells or of secondary cells. For example, the invention applies to cells having an organic electrolyte such as LiSO$_2$ primary cells or lithium-ion secondary cells, or indeed to cells having an aqueous electrolyte such as nickel-cadmium secondary cells or nickel-metalhydride secondary cells. The cells can be cylindrical or prismatic in shape. The number of cells making up the battery is not limited. The cells can be connected together in series and/or in parallel.

The invention also provides a method of manufacturing a system as defined above, in which said piece is resistance welded to said layer of copper. The resistance welding is preferably spot welding.

Spot welding is performed using electrodes of cylindrical shape having a diameter of about 1.2 mm. The electrodes are preferably made of copper or copper alloy.

The welding is performed at electrical energy lying in the range 50 W.s to 100 W.s. The total time required to perform said welding is much less than 1 second.

Welding is performed at a pressure lying in the range 60 N/mm$^2$ to 80 N/mm$^2$.

BRIEF DESCRIPTION OF THE DRAWING

The invention will be better understood and other advantages and features will appear more clearly on reading the following description given by way of non-limiting illustrating and with reference to the accompanying drawing in which the sole figure shows a battery of cells at different states of advance in making the electrical connection system of the present invention.

MORE DETAILED DESCRIPTION

The battery 1 of the invention comprises ten electrochemical cells 2, e.g. of the lithium-ion type. Each cell 2 has a positive connection piece 3 and a negative connection piece 4 extending therefrom. Each positive connection piece 3 is welded at 5 to the conductive stud 6 constituting the positive pole of the cell 2, and each negative connection piece 4 is welded at 7 to the container 8 of the cell which constitutes its negative pole, as shown in the central portion of the figure.

The connection pieces 3 and 4 are made of nickel and are inserted in passages 9 formed through the electronics card 10 which is spaced apart from the cells by insulating material 11, the connection pieces then being folded down onto the copper layer 12 of the corresponding tracks 13 on the printed circuit as shown on the right of the figure. Each connection piece 3, 4 is then spot welded at 14 to the copper layer 12, as shown to the left of the figure.

Connection systems of the present invention have been made using nickel connections of different origins and/or thicknesses (tests A to C). The characteristics and the results of the tests are summarized in the table below.

TABLE

| Test | A | B | C |
|---|---|---|---|
| Ni thickness ($\mu$m) | 0.125 | 0.127 | 0.140 |
| Cu thickness ($\mu$m) | 105 | 105 | 105 |
| Electrode shape | cylinder | cylinder | cylinder |
| Electrode diameter (mm) | 1.2 | 1.2 | 1.2 |
| Pressure (N/mm$^2$) | 71 | 71 | 71 |
| Current (A) or energy (W · s) | 50 W · s | 80 W · s | 80 W · s |
| Breaking strength (daN) | 2.8–2.5 | 2–2.1 | 2–1.6 |
| Shear strength (daN) | 14.4 | 9.9 | 9.5 |
| Resistance (m$\Omega$) | <0.07 | <0.07 | <0.07 |

The mechanical and electrical characteristics of the welds made in the above examples correspond to those expected by the user.

What is claimed is:

1. An electrical connection system between an electrochemical cell and an electronic card carrying a printed circuit having a copper track, said system comprising at least one metal piece electrically connected to said cell, wherein said copper track is of a thickness greater than 70 $\mu$m, and wherein said metal piece is inserted in a passage through said electronic card, bent and directly fixed to said copper track by welding without any filler metal.

2. A system according to claim 1, in which said track of copper is at least 105 $\mu$m thick.

3. A system according to claim 1, in which said piece is at least 80 $\mu$m thick.

4. A system according to claim 3, in which the thickness of said piece lies in the range 80 $\mu$m to 200 $\mu$m.

5. A system according to claim 3, in which said piece is at least 100 $\mu$m thick.

6. A system according to claim 5, in which the thickness of said metal piece lies in the range 125 $\mu$m to 140 $\mu$m.

7. A system according to claim 1, in which said metal piece is made of a metal selected from nickel, nickel-plated steel, stainless steel, and copper.

8. A system according to claim 1, in which said metal piece is a connection piece welded to said cell.

9. A system according to claim 1, in which the resistance of the connection after said metal piece has been welded to said track of copper is not greater than 0.07 m$\Omega$ for a current of 5 A.

10. A system according to claim 1, in which the breaking strength of said connection after said metal piece has been welded to said copper track is not less than 1.5 daN.

11. A system according to claim 1, in which the shear strength of said connection after said metal piece has been welded to said track of copper is not less than 8 daN.

12. An electrochemical cell connected to a printed circuit by an electrical connection system according to claim 1.

13. A battery of electrochemical cells including an electrical connection system according to claim 1.

14. A method of manufacturing an electrical connection system according to claim 1, in which said metal piece is welded by resistance welding to said track of copper.

15. A method according to claim 14, in which said metal piece is welded by spot welding to said track of copper.

16. A method according to claim 14, in which said welding is performed using electrodes of cylindrical shape with a diameter of about 1.2 mm.

17. A method according to claim 14, in which said welding is performed with energy lying in the range 50 W.s to 80 W.s.

18. A method according to claim 14, in which said welding is implemented at a pressure lying in the range 60 N/mm$^2$ to 80 N/mm$^2$.

* * * * *